United States Patent
Fischer

(12)
(10) Patent No.: US 6,255,869 B1
(45) Date of Patent: Jul. 3, 2001

(54) METHOD AND APPARATUS FOR SYSTEM RESOURCE NEGOTIATION

(75) Inventor: Frederick H. Fischer, Macungie, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/407,413

(22) Filed: Sep. 29, 1999

(51) Int. Cl.[7] .................................................. G06F 13/00
(52) U.S. Cl. .......................... 327/145; 327/146; 710/23; 711/148
(58) Field of Search ....................... 710/22, 23; 711/100, 711/104, 105, 147, 150; 713/500; 327/407, 141, 144, 145, 146

(56) References Cited

U.S. PATENT DOCUMENTS

| | | | |
|---|---|---|---|
| 5,394,557 | * 2/1995 | Ellis | 713/500 |
| 5,692,216 | * 11/1997 | Wolford et al. | 713/600 |
| 6,055,594 | * 4/2000 | Lo et al. | 710/100 |

* cited by examiner

*Primary Examiner*—Tuan T. Lam
(74) *Attorney, Agent, or Firm*—Synnestvedt & Lechner LLP

(57) ABSTRACT

A method and apparatus for negotiating access to a shared resource by two independent domains. A request register is provided to each domain for receiving an ownership request signal. Request signals received from both domains are clock-synchronized and fed to a cross-coupled circuit. The cross-coupled circuit includes two blocks, each having a switch and a register for receiving a request signal. The registers are responsive to different portions of a clock cycle, e.g., rising and falling edges. The switch in each block receives a signal from one domain on one input and a signal from the output of the register in the same block on the other input. The switch of one block is controlled by the output signal of the register of the other block. The output of one of the blocks is used to control a domain switch to permit data streams from the independent domains to reach the shared resource. Each domain requests use of the shared resource by sending a request signal to its respective request register. The cross-coupled circuit negotiates ownership and controls the domain switch. Simultaneous requests are time-separated due to the clock-phase based nature of the cross-coupled circuit.

17 Claims, 1 Drawing Sheet

METHOD AND APPARATUS FOR SYSTEM RESOURCE NEGOTIATION

FIELD OF THE INVENTION

This invention relates generally to integrated circuitry in which a common resource is shared by multiple domains. In particular, the invention relates to chips having a memory resource shared by two processor domains.

BACKGROUND OF THE INVENTION

Integrated circuitry incorporates and interconnects numerous electronic components. These electronic components may perform numerous functions and interact in complex ways. Some electronic components, referred to herein as "resources", are shared by one or more other components ("domains"), e.g., a digital signal processor ("DSP"). The resource is shared in that it may communicate with or serve numerous domains, albeit only one domain at any point in time. If two or more electronic domains were to attempt to use the shared resource simultaneously, data might be corrupted.

This gives rise to the concept of resource negotiation. Resource negotiation techniques are well known in chip design. Resource negotiation is performed to determine which domain is permitted to use the shared resource at a particular point in time in the event of conflict.

One common type of resource negotiation circuit uses a four-state state machine. For example, a chip may comprise two digital signal processor cores, DSP1 and DSP2 which share a common memory resource, such as a block of SRAM. A four-state state machine may be used in which the four states are represented by binary numbers 00, 01, 10, and 11, wherein state 00 indicates that neither DSP1 nor DSP2 is permitted to use the resource, i.e., neither "owns" the resource, 01 means that DSP1 owns the resource, 10 means that DSP2 owns the resource, and 11 is an inoperative state. The use of a four-state state machine is common because of the binary basis of digital logic, i.e., four states because four is a power of two. However, this leads to one inoperative state which tends to slow the resource negotiation circuit because the state machine must be "stepped" through the inoperative state to reach an operative state. Typically, the state machine is configured such that the inoperative state falls back to one of the other three operable states.

Also, the state machine is a "single clock edge" state machine, that is, it is configured to react on only one edge of each clock cycle, e.g., on the rising edge of the clock. If DSP1 and DSP2 issue sequential but nearly simultaneous requests, DSP1's request may be clocked into a resource negotiation circuit on the rising edge of the reference clock and DSP2's request may be delayed, after release of the resource by DSP1, while waiting for the next edge, e.g., rising edge, that controls the state machine. Delay, such as that caused while waiting for a next edge, is undesirable, particularly in high speed applications.

Additionally, a considerable amount of chip space is required to implement a single clock edge synchronous four-state resource negotiation circuit. Chip space is precious and more compact circuitry requiring less chip space is desirable, particularly in increasingly popular system-on-a-chip (SOC) designs.

SUMMARY OF THE INVENTION

The invention provides a method and apparatus for negotiating access to a shared resource by two independent domains. A request register is provided to each domain for receiving an ownership request signal. Request signals received from both domains are clock-synchronized and fed to a cross-coupled circuit.

The cross-coupled circuit includes two blocks, each having a switch and a register for receiving a request signal. The registers are responsive to different portions of a clock cycle, e.g., rising and falling edges. The switch in each block receives a signal from one domain on one input and a signal from the output of the register in the same block on the other input. The switch of one block is controlled by the output signal of the register of the other block.

The output of one of the blocks is used to control a domain switch to permit data streams from the independent domains to reach the shared resource.

Each domain requests use of the shared resource by sending a request signal to its respective request register. The cross-coupled circuit negotiates ownership and controls the domain switch. Simultaneous requests are time-separated due to the clock-phase based nature of the cross-coupled circuit.

DETAILED DESCRIPTION

Figure 1:
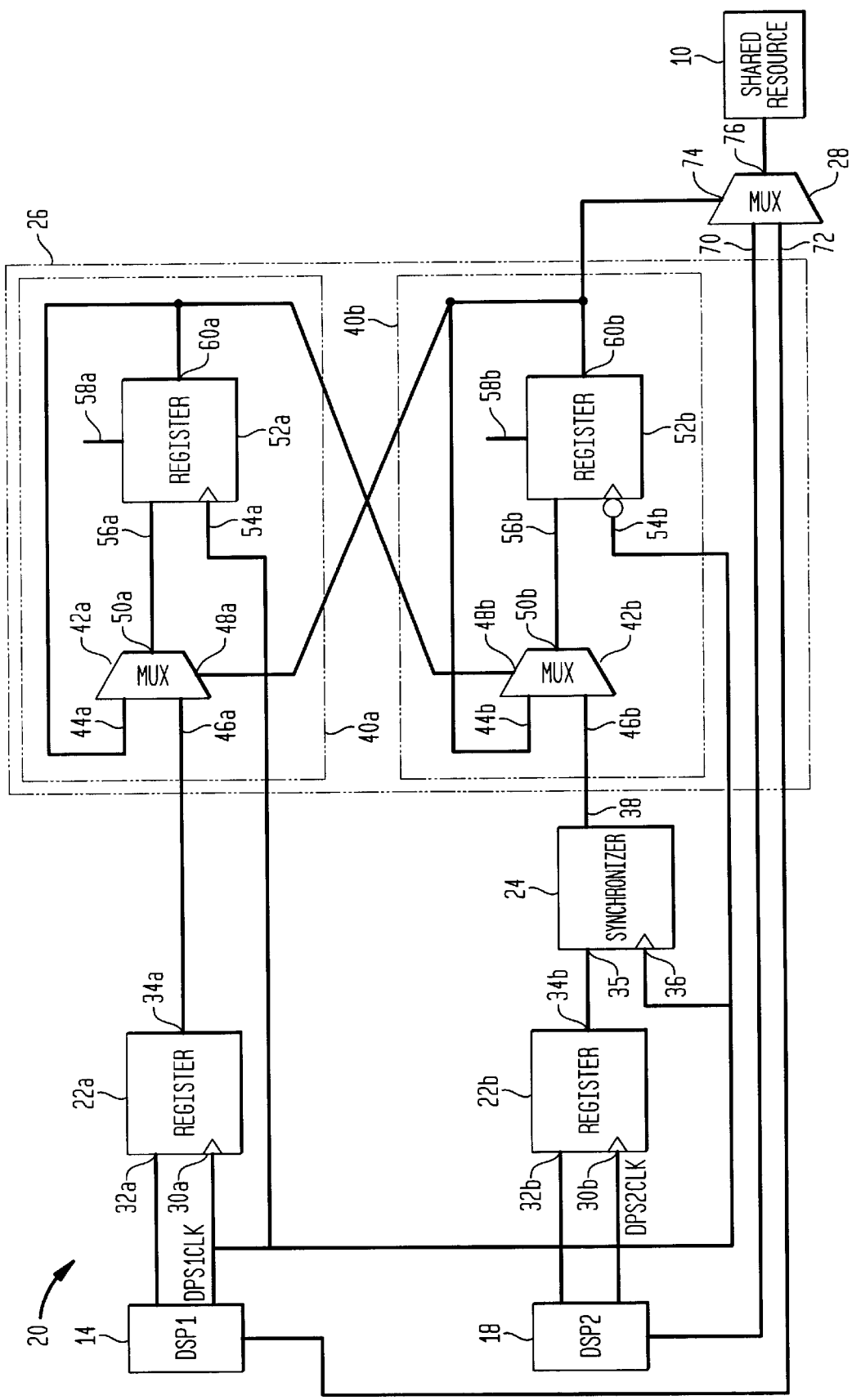
FIG. 1 is a block diagram of an exemplary resource negotiation circuit in accordance with the present invention.

The present invention provides a method and apparatus for negotiating access to a shared resource by independent domains where only one domain may use the shared resource at any point in time. In accordance with the present invention, a high-speed resource negotiation circuit using a clock-phase based, three-state state machine is provided for negotiating ownership of the shared resource. The circuit is clock-phase based in that it accepts ownership requests on a half-clock cycle basis.

FIG. 1 is a block diagram showing an exemplary resource negotiation circuit. As shown in FIG. 1, the resource negotiation circuit 20 controls use of a shared memory resource 10 by two digital signal processor domains (DSP1 and DSP2) 14, 18 having asynchronous clock signals, DSP1CLK and DSP2CLK, respectively. As shown in FIG. 1, the resource negotiation circuit 20 includes request registers 22a, 22b for receiving from each processor domain 14, 18 requests for ownership of the shared resource 10. The resource negotiation circuit 20 also includes a synchronizer 24 for synchronizing signals received from each domain to the clock of one domain, a three-state cross-coupled circuit 26 to perform the resource negotiation function, and a domain switch 28 to control use of the shared resource 10 by each processor domain 14, 18.

In the example, each request register 22a, 22b is a positive-edge triggered, D-type, flip flop. Each flip-flop 22a, 22b, has a clock terminal 30a, 30b, an input terminal 32a, 32b, and an output terminal 34a, 34b. For a positive-edge triggered flip flop, the bit appearing at the input terminal is propagated through the flip flop at the occurrence of the rising edge of the clock signal, i.e., as the clock signal transitions from 0 to 1. In the example, ownership requests have the form of a request bit value of "1" and ownership releases have the form of a release bit value of "0", the request and release bits being referred to collectively as a "request signal". Request signals are received from domains DSP1 and DSP2 on input terminals 32a, 32b of the corresponding flip flop 22a, 22b. The DSP1CLK and DSP2CLK clock signals are received at the respective clock terminals 30a, 30b of each flip flop 22a, 22b.

Each domain competing for ownership of the shared resource 10 may operate on its own asynchronous clock signal, such as DSP1CLK and DSP2CLK for domains 14, 18, respectively. Synchronizer 24 is employed to synchronize the request signals received from each domain 14, 18 to a single clock signal, namely DSP1CLK in the example. Circuitry to accomplish such synchronization is well known in the art. Any suitable synchronizer may be used. In the example of FIG. 1, synchronizer 24 has an input terminal 34, a clock terminal 36 and an output terminal 38. The synchronizer comprises two positive-edge triggered, D-type, flip flops each having a clock terminal, an input terminal and an output terminal (not shown). Each flip flop of the synchronizer receives the DSP1CLK signal at its respective clock terminal. The input terminal of one flip flop receives the signal from the output terminal of request register 22b and passes it to the input terminal of the second flip flop. The second flip flop passes the signal to its output terminal and to the output terminal 38 of the synchronizer 24. As a result of the synchronizer, the request signal sent from the synchronizer 24 on output terminal 38 is clock synchronized with the request signal sent from request register 22a on output terminal 34a.

The cross-coupled circuit 26 includes a first block 40a and a second block 40b. Each block includes a cross-coupled switch and a cross-coupled register. In the example, each cross-coupled switch is a two-to-one multiplexer 42a, 42b having a feedback terminal 44a, 44b, a request terminal 46a, 46b, a control terminal 48a, 48b and an output terminal 50a, 50b. Each multiplexer is configured to act as a switch between the signal received on the feedback path and the signal received at the request terminal. Each multiplexer is configured to pass the signal received on the feedback terminal when a 1 is received on the control terminal and to pass the signal received on the request terminal when a 0 is received on the control terminal.

The request signal sent from output terminal 34a, 34b of each request register 22a, 22b is received on the request terminal 46a, 46b of each cross-coupled switch 42a, 42b.

In the example, each cross-coupled register is an edge triggered, D-type, flip flop, 52a, 52b. Importantly, these cross-coupled registers 52a, 52b are triggered by opposite edges of a clock signal, i.e., the cross-coupled circuit 26 is a phase-based design. In the example, cross-coupled register 52a is a positive-edge triggered flip flop responsive to a rising edge of the clock signal and cross-coupled register 52b is a negative-edge triggered flip flop responsive to a falling edge of the clock signal. Each cross-coupled register 52a, 52b has a clock terminal 54a, 54b, an input terminal 56a, 56b, a reset terminal 58a, 58b for storing a 0 in the register and output terminals 60a, 60b.

For each block, the cross-coupled switch 42a, 42b receives a request signal from a request register 22a, 22b on one of its input terminals 46a, 46b and a signal from the output terminal 60a, 60b of a cross-coupled register 52a, 52b on the other input terminal 44a, 44b. The cross-coupled switch's output terminal 50a, 50b is coupled to the input terminal 56a, 56b of the corresponding cross-coupled register 52a, 52b. The DSP1CLK clock signal is received on the clock terminal 54a, 54b of each cross-coupled register 52a, 52b.

The cross-coupled circuit 26 is cross-coupled in that the signal from the output terminal 60a, 60b of the cross-coupled register 52a, 52b in each block is also used as a control signal for the cross-coupled switch in the other of the two blocks. For example, the output terminal 60a of the cross-coupled register 52a in the first block 40a is coupled to the control terminal 48b of the cross-coupled switch 42b of the second block 40b.

The domain switch controls use of the shared resource 10 by the processor domains 14, 18. In the example, the domain switch is a two-to-one multiplexer 28 having a first input terminal 70, a second input terminal 72, a control terminal 74 and an output terminal 76. The multiplexer 28 can send only one signal at any one point in time and is configured to pass to its output terminal 76 a signal received on the first input terminal 70 when a 1 is received on its control terminal 74 and a signal received on the second input terminal 72 when a 0 is received on the control terminal 74.

The output from the cross-coupled register 52a or 52b in one of the blocks 40a or 40b is used to control the domain switch 28. In the example, the output from terminal 60b of cross-coupled register 52b in the second block 40b, is fed to the control terminal 74 of the domain switch multiplexer 28. Data streams from domains DSP1 and DSP2 are received on input terminals 72, 70 respectively of multiplexer 28. The signal from output terminal 76 is sent to the shared resource 10.

In summary, ownership request signals are received by registers 22a and 22b. The requests are clock synchronized by synchronizer 24. Resource arbitration occurs primarily in the cross-coupled circuit 26, the output of which is used to control domain switch 28 to permit data streams from either DSP1 or DSP2 to reach the shared resource 10.

In use, the resource negotiation circuit functions as follows. In this eMamnple, it is assumed that both cross-coupled registers 52a, 52b in the cross-coupled circuit 26 are coming out of asynchronous reset, meaning they are each storing a 0 and a 0 appears at their output terminals 60a, 60b. The 0s appearing at the output terminals 60a, 60b are fed to the feedback terminals 44a, 44b of each respective cross-coupled switch 42a, 42b. It is also assumed that both DSP1 and DSP2 simultaneously issue requests for ownership of the shared resource 10 by writing a "1" to their respective request registers, 22a, 22b. The 1's are received on the input terminals 32a, 32b of the request registers 22a, 22b and propagated through each request register, i.e., "clocked in" on the rising edge of its respective clock signal, DSP1CLK and DSP2CLK respectively. This sets the output of each request register 22a, 22b.

The request signal sent from request register 22b on output terminal 34b is fed to the input terminal 35 of synchronizer 24 and is clocked in at the rising edge of the DSP1CLK signal. A request signal sent on output terminal 38 of synchronizer 24 is synchronized with the DSP1CLK signal. It is further assumed for this example that the request signal sent from output terminal 34a of request register 22a reaches cross-coupled switch 42a before the request signal from output terminal 34b propagates through synchronizer 24 and reaches cross-coupled switch 42b.

Accordingly, after DSP1 makes an ownership request, a 1 appears at the request terminal 46a of cross-coupled switch 42a. A 0 presently appears at the feedback terminal 44a, 44b and the control terminal 48a, 48b of each cross-coupled switch 42a, 42b due to the reset condition. As described above, the 0 appearing at the control terminal 48a of cross-coupled switch 42a means that the signal appearing at the request terminal 46a of cross-coupled switch 42a is allowed to propagate through the cross-coupled switch 42a to the output terminal 50a. Accordingly, the 1 request bit appearing at the request terminal 46a passes to the input terminal 56a of cross-coupled register 52a. The 1 request bit appearing at the input terminal 56a is clocked in to cross-coupled register 52a at the next rising edge of the DSP1CLK signal. The 1 request bit propagates through cross-coupled register 52a to the output terminal 60a and is fed to both the feedback terminal 44a of the cross-coupled switch 42a in the same block 40a and to the control terminal 48b of cross-coupled switch 42b in the other block 40b.

The 1 appearing at the control terminal 48b of cross-coupled switch 42b causes the cross-coupled switch 42b to be set to pass the signal received on its feedback terminal 44b. Therefore, the 0 appearing at the feedback terminal 44b of cross-coupled switch 42b due to the reset condition of cross-coupled register 52b is allowed to pass through the cross-coupled switch 42b.

At the next clock cycle, the 1 on input terminal 56a is again cycled through cross-coupled register 42a and the 0 on input terminal 56b is again cycled through cross-coupled register 42b. The 1's and 0's first and second blocks 40a, 40b are recycled until a release request, e.g., a 0 release bit, is received at the request terminal 46a of cross-coupled switch 42a in the first block 40a.

In the meantime, the 0 coming from output terminal 60b of cross-coupled register 52b is fed to the control terminal 74 of domain switch 28 to cause the switch to pass the signal received from domain DSP1 14 on its second input 72 to output terminal 76 and to the shared resource 10. Thusly, DSP1 is granted ownership of the shared resource by writing a 1 to its request register 22a. The state in which the register 52a of the first block 40a stores a 1 and the register 52b of the second block 40b stores a 0 is the "10" state. In this example, this first state corresponds to ownership of the shared resource by DSP1.

After DSP1 is finished using the shared resource, it terminates its ownership of the shared resource 10 by writing a release bit (0) to its request register 22a. As discussed above, the 0 is clocked in to request register 22a on the rising edge of the DSP1CLK signal. The 0 release bit propagates through the request register 22a and appears at the request terminal 46a of cross-coupled switch 42a. Because a 0 now appears at the control terminal 48a of cross-coupled switch 42a, the 0 release bit propagates through the cross-coupled switch 42a and appears at the input terminal 56a of cross-coupled register 52a and is clocked in at the next rising edge of the DSP1CLK clock signal. The 0 release bit then propagates through the cross-coupled register 52a to output terminal 60a and is fed back to the feedback terminal 44a of cross-coupled switch 42a as well as to the control terminal 48b of cross-coupled switch 42b. Because the control terminal 48a of cross-coupled switch 42a is still receiving a 0, the 0 release bit received on the request terminal 46a is allowed to propagate through cross-coupled switch 42a and appear at the input terminal 56a of cross-coupled register 52a. Thus, DSP1's writing of the 0 release bit to its request register 22a causes cross-coupled register 52a in the first block 40a to output a 0. This 0 release bit then controls the cross-coupled switch 42b in the second block 40b to cause it to pass a signal received on its request terminal 46b.

Assuming that DSP2 has made an ownership request, a 1 request bit appears at the request terminal 46b of cross-coupled switch 42b in the second block 40b. Since cross-coupled register 52b is negative-edge triggered, the 1 request bit is clocked in to cross-coupled register 52b on the falling edge of the DSP1CLK clock signal. Using the next edge after the resource is released, i.e., the falling edge, rather than waiting for the next rising edge, saves a half clock cycle's worth of time and therefore accelerates operation of the circuit.

The 1 request bit from DSP2 propagates through the cross-coupled register 52b to its output terminal 60b and is fed back to the feedback terminal 44b of cross-coupled switch 42b and to the control terminal 48a of cross-coupled switch 42a. The 1 appearing at the control terminal 48a of cross-coupled switch 42a causes the 0 appearing at the feedback terminal 44a of cross-coupled switch 42a to be propagated through the switch 42a and be recycled by cross-coupled register 42a. The 0 appearing at the control terminal 48b of the cross-coupled switch 42b causes the 1 appearing on the feedback terminal 44b to be propagated through the cross-coupled switch 42b and be recycled by cross-coupled register 52b.

The 1 appearing at the output terminal 60b of cross-coupled register 52b is also fed to the control terminal 74 of domain switch multiplexer 28. In this manner, the cross-coupled circuit 26 controls the domain switch 28. The 1 received on the control terminal 74 causes the signal received on the first input terminal 70 to be propagated through the domain switch multiplexer 28. Therefore, the data stream from DSP2 received on first input terminal 70 is propagated through domain switch multiplexer 28, thereby permitting DSP2 to use the shared resource 10. The state in which the register of the first block stores a 0 and the register of the second block stores a 1 is the "01" state. In this example, this second state corresponds to ownership of the shared resource by DSP2.

A release request in the form of a release bit 0 written by DSP2 to request register 22b is processed in a similar manner, causing the shared resource 10 to revert to DSP1 ownership, which continues until another DSP2 ownership request is processed.

Each block 40a, 40b in the cross-coupled circuit 26 is stable in that once a bit value is stored in a cross-coupled register 52a, 52b that bit value is recycled through the block and maintained until the next request signal is issued. In this manner, when a first domain's request for ownership of the shared resource is received into a block of the cross-coupled circuit in the form of a request bit, that request bit level is maintained by the block to control the domain switch until a request to release the block is received from the same domain. The domain switch allows the first domain to use the shared resource to the exclusion of the second domain. When the first domain is finished using the shared resource, it sends a release bit to the cross-coupled circuit. The cross-coupled circuit is then available to the second domain. A request bit sent from the second domain during use of the shared resource by the first domain is received into the second block of the cross-coupled circuit within a half-clock cycle after release by the first domain. This switches the domain switch to permit the second domain to use the shared resource. That request bit level is maintained in the second block until the second domain is finished using the shared resource, as indicated by transmission of a release bit. Request bits sent simultaneously by both domains are processed asynchronously due to the phase-based design of the cross-coupled circuit. The first bit processed by the cross-coupled circuit depends upon the phase of the clock at the time of the request.

Since a 0 appears at the control terminal 74 of domain switch multiplexer 28 as the result of asynchronous terminal reset of cross-coupled register 52b, DSP1 has ownership of the shared resource 10 regardless of whether it has made an ownership request. The state in which the register 52a of the first block 40a stores a 0 and the register 52b of the second block 40b stores a 0 is the "00" state. In this example, this third state, the reset or default state, corresponds to ownership of the shared resource by DSP1. A fourth state, i.e., a "11" state, is impossible due to the clock-phase based nature of the cross-coupled circuit.

Having thus described particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention.

Accordingly, the foregoing description is by way of example only, and not limiting. The invention is limited only as defined in the following claims and equivalents thereto.

What is claimed is:

1. A circuit for negotiating access to a shared resource by first and second electronic components comprising:
   first and second switches corresponding to said first and second electronic components, each switch being coupled to receive at a first input terminal a request signal for access to the shared resource from said corresponding electronic component and having a second input and output and control terminals; and
   first and second registers corresponding to said first and second switches, respectively, each register having an input terminal coupled to said output terminal of said corresponding switch, and an output terminal coupled to said second input terminal of said corresponding switch and said control terminal of said other switch;
   wherein said first and second registers respond to opposite edges of a clock signal.

2. The circuit of claim 1, wherein said output terminal of said first register is coupled to a control terminal of a third switch for selecting one of two signals received on first and second input terminals, respectively, of said third switch and passing said one of two signals to an output terminal of said third switch.

3. The circuit of claim 2, wherein each of said first, second and third switches comprises a multiplexer.

4. The circuit of claim 3, wherein each of said first, second and third switches comprises a two-to-one multiplexer.

5. The circuit of claim 1, wherein said first and second electronic components operate on first and second clock signals and wherein said circuit further comprises a synchronizer for synchronizing one of said request signals.

6. The circuit of claim 5, wherein said synchronizer synchronizes one request signal from one electronic component to said clock signal of said other electronic component.

7. The circuit of claim 6, further comprising third and fourth registers corresponding to said first and second electronic components, respectively, each of said third and fourth registers having an output terminal coupled to the first input terminal of a corresponding one of said first and second switches, respectively, and an input terminal for receiving a corresponding one of said request signals from a corresponding one of said first and second electronic components, respectively.

8. The circuit of claim 7, further comprising an inverter coupled to a clock terminal of one of said first or second registers.

9. The circuit of claim 2, wherein said request signals have a first state indicating a request for access to said shared resource and a second state indicating a release of said shared resource whereby a first in time request signal from one of said first and second electronic components prevents a second in time request signal from the other of said first and second electronic components from affecting output from the third switch until said first in time request signal changes from the first state to the second state.

10. The circuit of claim 9, wherein said first in time request signal is clocked into one of said first and second registers and said second in time request signal is clocked into another of said first and second registers on a next clock edge after said first in time request signal changes to the second state.

11. The circuit of claim 1, further comprising an inverter to invert a clock signal received by one of the first and second registers and wherein each of the first and second registers comprises a positive-edge triggered, D-type, flip flop.

12. The circuit of claim 1, wherein the first register comprises a positive-edge triggered, D-type, flip flop and the second register comprises a negative-edge triggered, D-type, flip flop.

13. A method for negotiating access to a shared resource by first and second electronic components, the method comprising the steps of:
   (a) receiving request signals from first and second electronic components;
   (b) clocking the request signals into first and second registers responsive to opposite edges of a clock signal;

(c) preventing a second in time request signal from being clocked into the second register until a first in time request signal and a release signal are clocked into the first register.

14. The method of claim 13, wherein step (c) comprises providing first and second switches corresponding to the first and second registers, respectively, each having an output terminal coupled to an input terminal of the corresponding register and a first input terminal coupled to an output terminal of the corresponding register, and controlling the switch corresponding to one register with the output from the other register.

15. The method of claim 14, further comprising the step of:

(d) synchronizing the first and second request signals to a single clock signal.

16. The method of claim 15, further comprising the step of:

(e) storing the first and second request signals in third and fourth registers, respectively, coupled to a second input terminal of the first and second switches, respectively.

17. A method for negotiating access to a shared resource by first and second electronic components comprising the steps of:

(a) providing first and second switches corresponding to said first and second electronic components, each switch being coupled to receive at a first input terminal a request signal from the corresponding electronic component and having a second input, output and control terminals; and (b) providing first and second registers corresponding to said first and second switches, respectively, each register having an input terminal coupled to said output terminal of said corresponding switch, and an output terminal coupled to said second input terminal of said corresponding switch and said control terminal of said other switch;

wherein said first and second registers respond to opposite edges of a clock signal.

* * * * *